(12) United States Patent
Hetzler

(10) Patent No.: US 6,489,693 B1
(45) Date of Patent: *Dec. 3, 2002

(54) METHOD AND DEVICE FOR CURRENT MONITORING IN A CURRENT SUPPLY SYSTEM

(75) Inventor: Ullrich Hetzler, Dillenburg-Oberscheld (DE)

(73) Assignee: Isabellenhutte Heusler GmbH KG (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/501,438

(22) Filed: Feb. 10, 2000

(30) Foreign Application Priority Data

Feb. 15, 1999 (DE) .......................... 199 06 276

(51) Int. Cl.$^7$ ............................... G01R 31/02
(52) U.S. Cl. .................. 307/10.1; 307/9.1; 307/38
(58) Field of Search ................. 307/9.1, 10.1, 307/38–41

(56) References Cited

U.S. PATENT DOCUMENTS

| | | | | |
|---|---|---|---|---|
| 4,819,117 A | * | 4/1989 | Brennan et al. | 361/18 |
| 4,942,571 A | | 7/1990 | Moller et al. | |
| 5,122,968 A | * | 6/1992 | Bauer et al. | 364/483 |
| 5,172,062 A | | 12/1992 | Eisermann | |
| 5,173,685 A | * | 12/1992 | Nimmo | 340/642 |
| 5,331,314 A | * | 7/1994 | Koch | 340/661 |
| 5,426,416 A | * | 6/1995 | Jefferies et al. | 340/664 |
| 5,854,555 A | * | 12/1998 | Sasaki | 324/539 |
| 6,011,416 A | * | 1/2000 | Mizuno et al. | 327/108 |
| 6,034,521 A | | 3/2000 | Eckardt | |

FOREIGN PATENT DOCUMENTS

| | | | | |
|---|---|---|---|---|
| DE | 3440986 A1 | 5/1986 | | |
| DE | 3615531 A1 | 5/1987 | | |
| DE | 3730 468 A1 | 3/1989 | | |
| DE | 3942 165 A1 | 6/1990 | | |
| DE | 195 07 959 C1 | 7/1996 | | |
| DE | 195 10 662 C2 | 6/1998 | | |
| EP | 0011454 | * | 5/1980 | ........... B60Q/11/00 |
| EP | 0 408 867 | | 5/1990 | |
| EP | 0 605 800 B1 | | 3/1996 | |
| GB | 2 226 896 A | | 12/1988 | |
| GB | 226896 A | * | 7/1990 | ........... G05B/23/02 |
| JP | 63-27769 | | 2/1988 | |
| JP | 2-165070 | | 6/1990 | |
| JP | 5-312847 A | | 11/1993 | |
| JP | 08099678 A | * | 4/1996 | ........... B62K/25/02 |
| JP | 8-186011 A | | 7/1996 | |
| JP | 08258622 A | * | 10/1996 | ........... B60Q/11/00 |

* cited by examiner

Primary Examiner—Fritz Fleming
(74) Attorney, Agent, or Firm—Cook, Alex, McFarron, Manzo, Cummings & Mehler, Ltd.

(57) ABSTRACT

In a power supply system supplying several loads (10, 11, 12) using a joint power bus (LB) and connecting electronic control units ($\mu$C) with each other and the loads by means of a control bus (CAN) for digital information and control data, a measuring resistor (21) connected in series with the power bus measures the total current of the loads connected, measurement information is transferred on the control bus (CAN), and the differential current resulting from a switching process is evaluated by the control system. The measuring resistor (21) comprising a metal alloy is integrated with a semiconductor chip with heat conducting connection directly or via a printed circuit board (PCB), which contains the whole evaluation and transmission electronics, into a small, compact current measuring module.

19 Claims, 4 Drawing Sheets

METHOD AND DEVICE FOR CURRENT MONITORING IN A CURRENT SUPPLY SYSTEM

Figure 1:
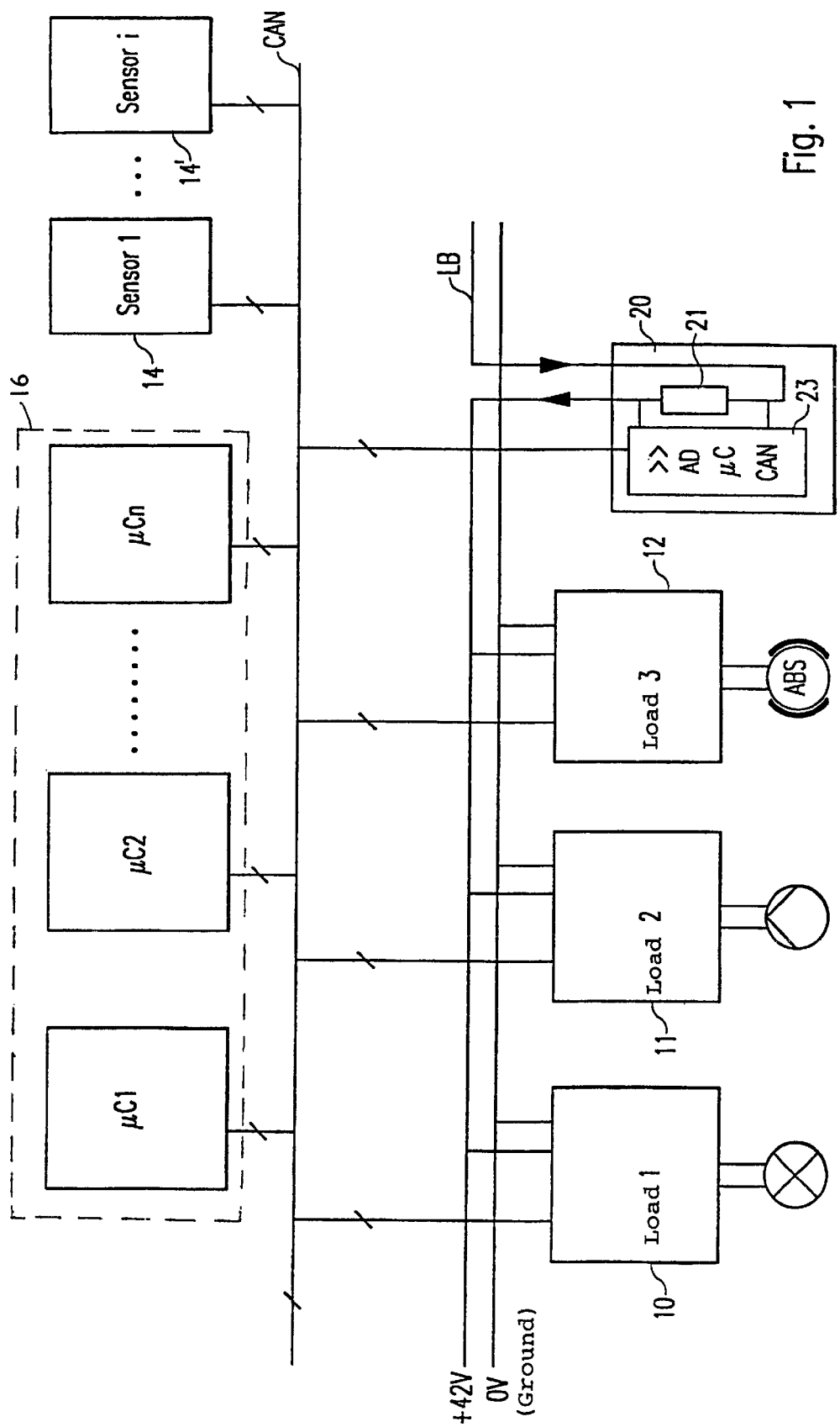

The invention concerns a procedure for current monitoring in a power supply system and a current measuring installation suitable for this purpose.

A typical example for a power supply system of the type examined here is supply of the number of loads growing from year to year in motor vehicles due to increasing requirements made of comfort, safety and environmental compatibility. It proves to be advisable due to the correspondingly increased power consumption to connect all loads by a common power bus in ring or star connection to a power source of relatively high voltage of for instance 42V, which enables lower currents than the 12V batteries usual up to now and enabling correspondingly smaller line diameters. For instance, assuming overall consumption of up to 5 kW, then at 42V a maximum total current of 120 A results, which may still be easily handled in motor vehicles. The source of high voltage may of course be provided in addition to an on board network for lower voltages.

For exchange of control data and information between the also increasing number of different processors, actuators and sensors of motor vehicles, for instance for motor control and comfort electronics (window lift, automatic seat adjustment, airconditioning, etc.), largely the use of standard data bus systems (for instance the so-called CAN bus) has prevailed, which may be located in parallel to the power bus. For the required semiconductors, a power supply network with higher voltages like for instance 42V is also advantageous, because for different reasons the semiconductor surface for secure switching of a load is much smaller than in case of a 12V on board network.

With an increasing number of loads and rising overall power, on the other hand the danger of faults and especially of short circuits increases, whose consequences may form a catastrophe for the safety and function of the motor vehicle. The fire hazard is especially large. Of corresponding magnitude were the requirements for safety and functionality monitoring up to now, using fuses and current measuring elements typically individually associated to the individual loads.

The primary object of the invention is a method or respectively a current measuring device enabling in a simple manner at less expenditure as up to now, quick and as exact as possible current monitoring in power supply systems, for instance of a motor vehicle with numerous loads.

This task is solved by the characterizing features of the patent claims.

According to a first aspect of the invention, each load is not associated with its own current sensor, but several or even all loads are preceeded by a single sensor resistor in series with the power bus for permanent current monitoring. Current sensing is performed quickly and precisely and may be temporally exactly associated to switching a load on or off by means of the control bus. Because the respective actual current value is directly accessible to any existing processor or other control device by means of the control bus, the electronic control and monitoring system may determine without any problem if for the respective switching process normal current changes result or not. For instance, it is possible to determine the load of actuators from their current consumption and therefore faulty functionality or faults of the respective motors (window lifters, starter, ventilator, etc.) may be detected. Specifically permanent sensing of the total current in the vehicle may be of great importance for detection of faults. The current of a generator feeding the power bus may also be monitored.

Because many or all loads and possibly the generator may be monitored using a single current sensor resistor, it is possible to omit numerous current sensors and safety circuits required up to now, like for instance individual lamp current sensing, fuses, etc. Beyond this, totally new opportunities for safety and functionality tests are created. The control system may also generate switching signals for any control processes from evaluation of the measured differential current, for instance to switch off individual loads not urgently needed, like for instance the rear-window heater, if the total current is too high.

Location of the measuring resistor within or in series with the power bus according to the invention also in a simple manner enables current control to protect the battery feeding the bus and the connected loads, especially with the goal of extending the service life of the battery, By measuring the total current flowing on the bus, it is also possible to monitor and limit the charging and discharging current of the battery.

Which monitoring is in detail undertaken within a vehicle essentially is a question of the existing control system and the associated software. But the design of the current sensor could be same for all applications.

The constructional control expenditure may be reduced to a minimum by the fact that, according to the current semiconductor technology, it is possible to integrate a complete control unit for the control bus together with the circuits required for the measuring resistor like measuring amplifier, A/D converters, processor, memories, etc. in a single small semiconductor chip as application specific integrated circuit (ASIC) which may be produced cheaply.

Of decisive importance for desired quick and extremely precise current sensing are on the one hand the measuring precision of the measuring resistor used and on the other hand interference and noise free transmission of the measured voltage of the resistor to the control system. For this purpose, besides avoiding external interfering signals, it is especially necessary to be independent of temperature effects.

These problems are solved according to an important other aspect of the invention by means of a current measuring module for which the semiconductor chip associated to the resistor is located directly or via a heat-conducting circuit board or PCB on the metal surface of the resistor, which is preferably plate-shaped, the chip preferably being situated in the center of the resistor surface. Besides its small volume and simple, cost-efficient production, this current measuring module has the advantage of extremely short connections between the power connections of the measuring resistor and the associated semiconductor circuits with the consequence that no substantial interfering voltages may be induced. Beyond this, due to thermal coupling, optimal temperature compensation is possible. The resistor should preferably be a component with a plate-shaped resistor element consisting of a resistor alloy, at whose edges in known manner (EP 0 605 800 B1) plate-shaped connectors are welded. The resistor may be produced with a very small resistance value, for instance of the magnitude of 0.1–0.5 mOhms, which means correspondingly small dissipation power even in case of substantial currents, which in the case of vehicles may for a short time amount up to 500 A.

Current measuring modules of the design described here may be employed for sensing the total current of several or all loads of the system, or for individual current measurement be connected into the power circuit of individual loads or individual groups of (for instance 2) loads.

Figure 2:
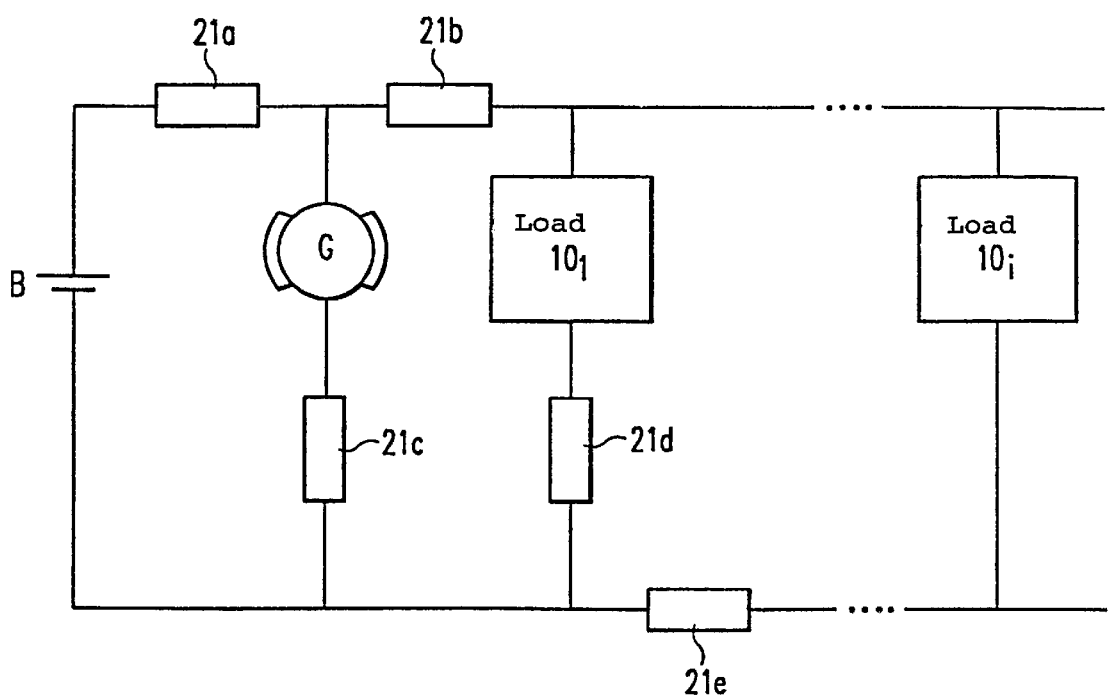
Figure 3:
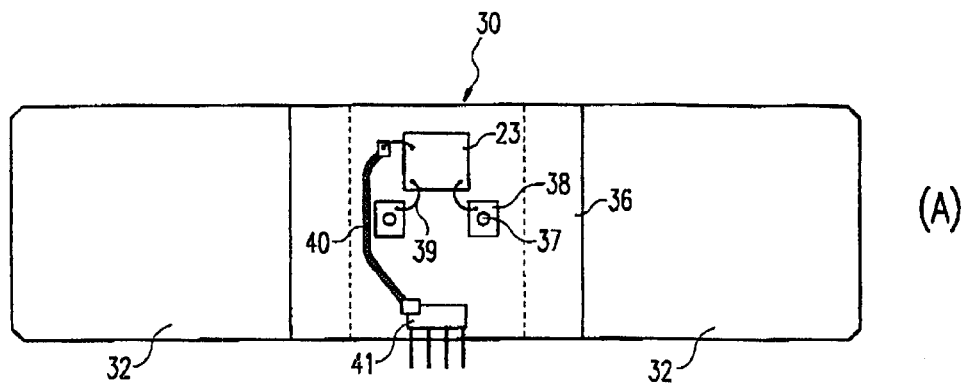
Figure 3:
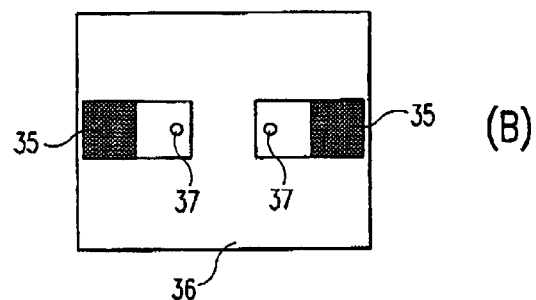
Figure 3:
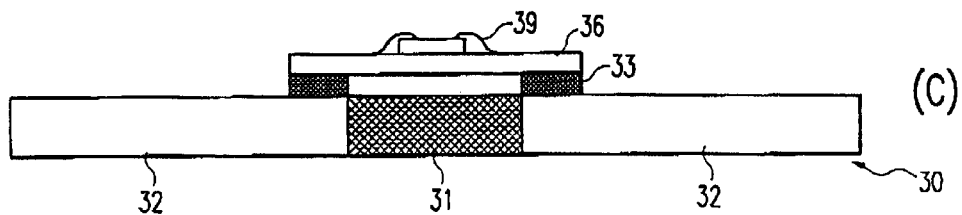
Figure 4:
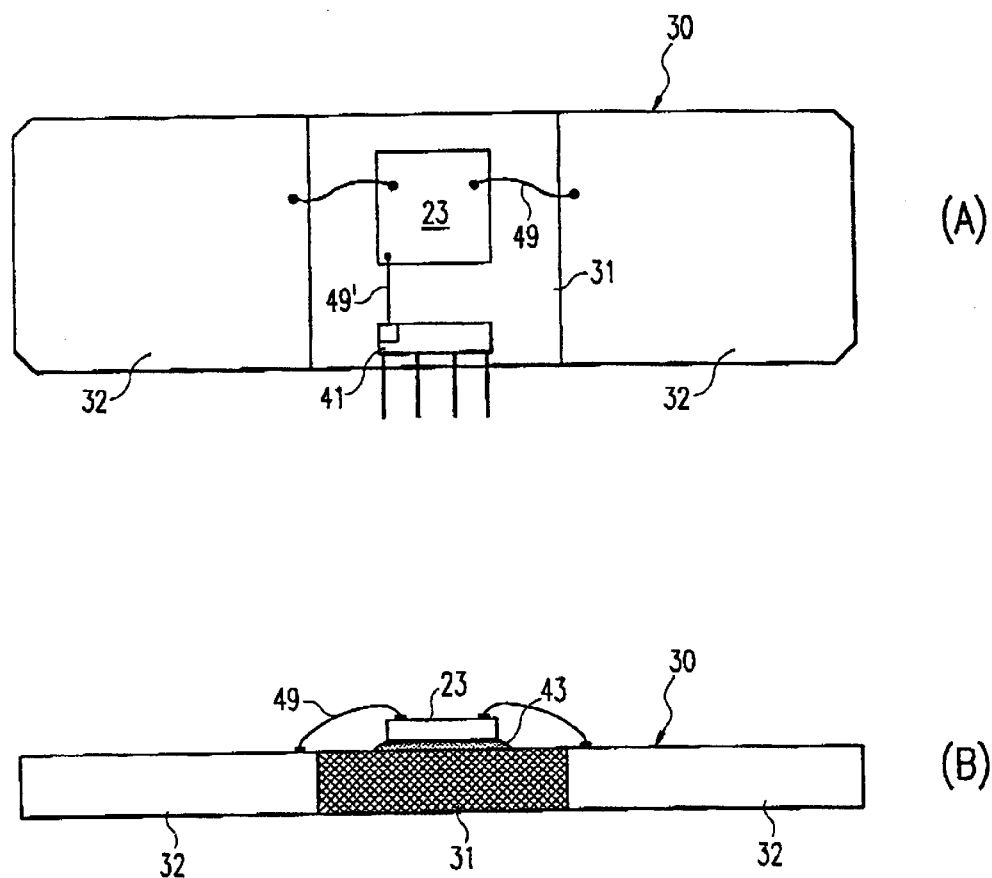

The invention is now described in closer detail using the example of a power supply system of a motor vehicle. The drawing shows in FIG. 1 the conceptual design of the control and power bus system including a current sensor;

FIG. 2 different possibilities for locating current sensors for monitoring components of the power supply system;

FIG. 3 different views of a current measuring module suitable for the system according to FIG. 1 corresponding to a first embodiment, and FIG. 4 views of another embodiment of the current measuring module.

According to FIG. 1, three loads 10, 11 and 12, like for instance an incandescent lamp, a water pump and an antilock braking system with their respective associated switching units, are connected via a power bus LB in series to a power current generator (not shown), whose voltage may for instance be 42V. The switching units of the loads 10 through 12 are further connected via data lines to a common control bus CAN which in known manner connects with each other a multitude of microcontrollers (microprocessors for specific control tasks) $\mu C1, \mu C2 \ldots \mu Cn$, for instance for motor management, comfort electronics, temperature control, etc. and/or for control of the stated loads, as well as sensors 14, 14', for instance for cooling water temperature, motor speed, etc.

A single current measuring module 20 serves to monitor the currents for the loads 10, 11 and 12 shown, which essentially consists of a resistor element 21 having two current connections and two separate voltage connections and of a semiconductor chip 23 connected to the voltage connections. The resistor element 21 is connected as shown by its voltage connectors electrically in series into the power bus between the 42V power generator and the loads 10 through 13, so that their total current flows through the resistor element 21. The semiconductor chip 23 may contain a measuring amplifier, an A/D converter and a microcontroller as well as data memories and may be connected to a plug of the current measuring module 20 for connection to the control bus CAN.

As has already been mentioned, the control bus CAN is a standardized system which transmits digital information and control data in a defined "language" or coding between the connected sensors, processors and actuators. If one of the loads 10 through 12 is to be switched on, the electronic control means 16 for the system, for instance one of the microcontrollers, at first enquires via the control bus CAN the present measuring value for the current from the current measuring module 20 and stores it. Then, switching is performed and after a preset short waiting time, the control enquires the new measured current value resulting after the switching process. The measured differential current may now be compared using a stored prescribed setpoint or set range and in case of abnormal deviation, a warning signal may be created, or if required for safety reasons, the current may be switched off.

Generally, it may be preferred to permanently make available the value of the continuously measured current via the control bus CAN to as many controllers or processors of the control system as possible. Evaluation of this current measurement and the resulting switching measures are left to the respective individual case.

It is also conceivable to perform evaluation of current measurement in the own semiconductor chip 23 of the current measuring module 20 and to only apply the possibly resulting switching control signals to the control bus CAN or any other control system.

While FIG. 1 only provides for a single current measuring module 20, it may in many cases be sensible to employ one module each in different places of the power supply system into the power bus system. Some possibilities for this are shown in FIG. 2, in which a battery B, a generator G (which may also serve as starter motor), any loads $10_1 \ldots 10_i$ and five measuring resistors 21a through 21e are located in different locations as shown. As shown, the resistor 21a measures the battery current, the resistor 21b the total load current, the resistor 21c the generator current, the resistor 21d the individual current of the load $10_1$ and the resistor 21e the current of a remaining group of loads.

As has already been mentioned, using a resistor connected into the power bus, like for instance resistor 21a, the charging and discharging currents of the battery may be monitored and the measuring signals or control data derived therefrom and communicated on the associated control bus (not shown in FIG. 2) may be used to limit the current to a maximum value admissible for the battery. A similar opportunity consists in preventing excess charging or excess discharging of the battery using control data gained from the measurement signals.

A first suitable design of a current measuring module suitable especially (but not exclusively) for the purpose regarded here is shown in FIG. 3, whereby FIG. 3A shows the top side of the module, FIG. 3B the lower side of a PCB of the module and FIG. 3C a side view, in each case without a casing encapsulating the components of the module.

The resistor 30, shown from above in FIG. 3A and from the side in FIG. 3C, is overall plate-shaped and formed in the known manner from a resistor element 31 of a metallic alloy, preferably copper-based, for instance based on CuMnNi like CuMn12Ni, to whose opposite edges the edges of also plate-shaped power connection parts 32, preferably made of copper, are welded on. The welded joint may be suitably made by electron-beam welding.

Directly next to the respective welded joint, on the surface of the connecting pieces 32, there are solder connection pads 33, to which preferably gold-plated or tinned soldering areas 35 (FIG. 3B) are soldered on the lower side of a PCB 36 situated directly above the resistor element 31. Except for the soldered areas 35, the lower side of the PCB 36 may be covered by solder resist. The soldered areas 35 are connected to the conductive areas 38 (FIG. 3A) on the surface of the PCB by means of feed-through contacts 37. The PCB may consist of heat conducting insulating material as known per se.

About in the middle between the lateral edges of the PCB 36 and therefore also in or above the center of the resistor element 31, on the upper side of the PCB 36, for instance using an adhesive film of heat conducting material, a semiconductor chip 23 is mounted, which has connections electrically connected via bonding wires 39 to the conducting areas 38 and therefore the resistor 30.

Due to the configuration and connections described, the semiconductor is fed with the voltage picked off directly at the transition locations between the resistor element 31 and its copper power connection parts 32, which voltage is created according to the usual 4-conductor measurement by the current flowing through the power connection parts and the resistor element 31. The power connections of the connecting parts 32 required for this measurement are not shown. The connection may for instance be made directly to a main power cable or via busbars to a battery. A general advantage of the design described is the possibility of customization of the power connection to the respective application case without any problem.

Further connections of the semiconductor chip 23 are connected to a plug 41 via conductive tracks 40 of the PCB 36. The plug 41 for instance has two pins for transmission of measured data and two further pins for voltage supply of the semiconductor chip 23 and may be designed to be connected to the standardized databus CAN. By means of this connection, the measured voltage of the resistor may be referred to the earth connector of the databus CAN. The plug 41 may, like the semiconductor chip 23, be glued to the PCB 36.

Advantageous features of the current measuring module described are its small structural volume, minimum interfering voltages due to the extremely short connecting lines, optimum temperature compensating opportunities as well as the possibility of a very low overall resistance and corresponding low loss of power and may be produced with little expenditure and correspondingly at low cost. For manufacture of the design shown in FIG. 3, at first the PCB 36 may be completely prefabricated and all components mounted on it. Alternatively to the electrical connection of the semiconductor to the PCB 36 by bonding wires 39, a so-called BGA design (ball grid array) is also possible, for which contact is made using a reflow soldering process. The PCB 36 may then be soldered to the resistor 30 using the reflow procedure, whereby the already tinned or gold-plated solding areas on the lower side of the PCB are connected to the copper surfaces of the resistor, so that the arrangement shown in FIG. 3C results.

The whole area around the active resistor element 31 with the semiconductor chip 23 thereon and with the plug 41 and possibly the PCB 36 may after assembly be covered with plastic, for instance thermosetting plastic or duroplastic for formation of a casing, so that a compact, mechanically stable component with two power connections at the exposed connecting parts 32 and with the plug 41 results.

In FIG. 4, another embodiment of the current measuring module is shown, whereby FIG. 4A is a top view and FIG. 4B a side view, in each case without casing or encapsulation. The module may contain the same resistor 30 and the same semiconductor chip 23 and also for instance be provided with a CAN plug 41, as the embodiment according to FIG. 3. However, the semiconductor chip 23 is in this case adhered directly on the metallic surface of the resistor element 31, as shown about in the middle of the resistor surface which may be substantially larger than the chips, by means of an electrically insulating, but thermally well conducting adhesive 43, for instance an adhesive foil. The plug 41 is also adhered onto the resistor in this case. Bonding wires 49 and 49' form the electrical connections of the semiconductor chip 23 to the power connection parts 32, preferably again in the immediate vicinity of the transition points between alloy and copper, and to the plug 41, respectively. An advantage of this design is especially good thermal coupling between semiconductor and resistor and the especially low and cost-effective production expenditure.

The semiconductor chip 23 may as ASIC (application specific integrated circuit) contain for instance the complete evaluation and signal transmission electronics required for current measurement including amplifier circuit, A/D converter and microprocessor in the smallest possible space (a few mm chip edge length). In addition, it contains a specific temperature sensor, formed in a manner known per se as a semiconductor element (transistor), which due to the heat coupling described continuously measures the temperature of the resistor element 31, and from whose measuring information for instance the processor of the chip, in this case serving as temperature compensating circuit, computes correction data for the current measuring signals. By means of this compensation of the actually small influence of the temperature coefficient (TC) of the resistor, the highest possible measuring precision of the resistor is achieved, which resistor is already very precise due to its alloy type.

The semiconductor chip 23 may furthermore contain a specific permanent memory, for example of the type EEPROM, which is used for calibration of the measuring resistor. For this purpose, at first after production of the resistor 30 its actual value is measured, possibly in dependence on temperature, and digitally stored. Later on, after mounting of the resistor in the current measuring module and possibly only after its installation in the power supply system for instance according to FIG. 1, the actual resistance value is transmitted, preferably via the control bus CAN, as calibration data to the semiconductor chip 23 and stored permanently there. The stored calibration data are used during the current monitoring operation for continuously controlling the measuring circuit connected to the resistor for generation of corrected measured data. The calibration effort otherwise necessary for measuring resistors is omitted.

A practically realized current measuring module of the type described with a resistance value of the magnitude of 0.1–0.5 mOhm is able to measure short-term currents up to 500 A and continuous currents of up to 200 A. The measuring resolution may be 14 to 16 bits, the measuring frequency >1 kHz corresponding to a measuring time <1 msec. The current measuring module may be used in the whole range of power supply voltage and may be integrated without any problem into existing control modules, for instance of a motor vehicle, like for instance regulators and safety switching-off devices.

What is claimed is:

1. Method for current monitoring in a current supply system in which current is supplied from a power source to a plurality of switchable loads (10, 11, 12) each of a different resistance, via a power bus (LB) common to each of said loads (10, 11, 12), and in which a control bus (CAN) for digital information and control data is connected to electronic control means (16) and connects a plurality of electronic control units ($\mu C1, \mu C2 \ldots \mu Cn$) to each other and to said loads (10, 11, 12), the method comprising the steps of:

provinding a current measuring module (20) comprising a sensor resistor (21) and a semiconductor element (23) generating digital measuring data corresponding to the current through said resistor (21);

said module (20) measuring the total current of all of said loads (10, 11, 12) connected to the power bus (LB), said resistor (21) being connected to the power bus in line between said power source and said plurality of loads;

the digital measuring data generated by said module (20) and corresponding to said measured total current being applied to said electronic control means (16) via said control bus (CAN);

and monitoring the function of one of said switchable loads (10, 11, 12) by:

applying the digital total current measuring data to said electronic control means (16) before said one load is switched;

applying the new digital total current measuring data to said electronic control means after switching of said one load; and said electronic control means (16) determining the difference between the two values of the digital total current measuring data provided before and after said switching;

evaluating said total current difference by comparing it with stored reference data, and generating a signal in case of abnormal deviation of the current difference from the reference data.

2. Method according to claim 1 wherein said sensor resistor is made of a copper-based alloy.

3. Method according to claim 1, characterized in that said electronic control means for evaluation of the differential current compares this difference with a stored prescribed setpoint or setting range and in case of abnormal deviation creates a warning signal.

4. Method according to claims 1 or 2, characterized in that a metallic measuring resistor is used as current sensor resistor (21), whose power connections are electrically connected into said power bus (LB) in series and whose analog measuring voltage generated at its voltage connections is converted into digital measuring signals by a semiconductor chip (23) and is integrated with said resistor in a common casing as a current measuring module (20), said measuring signals being applied to said control bus (CAN).

5. Method according to claim 4, characterized in that a resistor (21) with a plate-shaped element (31) made of a resistor alloy is used as a current sensor, on whose edges plate-shaped power connection parts (32) are welded.

6. Method according to claim 1 or 2 characterized in that said current sensor resistor (21) is calibrated by external digital data which are gained by measurement of said current sensor resistor's actual resistance value and stored in a semiconductor memory connected to said resistor and which during current monitoring operation control a measuring circuit connected to said resistor for generation of corrected measuring data.

7. Method according to claim 6, characterized in that the external calibration data is transmitted to the semiconductor memory via the control bus (CAN).

8. Method for current monitoring in a current supply system in which current is supplied from a battery (B) to a plurality of switchable loads (10, 11, 12) each of a different resistance, via power bus (LB) common to each of said loads (10, 11, 12), and in which a control bus (CAN) for digital information and control data is connected to electronic control means (16) and connects a plurality of electronic control units (μC1, μC2 . . . μCn) to each other and to said loads (10, 11, 12), the method comprising the steps of:

providing a current measuring module (10) comprising a sensor resistor (21) and a semiconductor element (23) generating digital measuring data corresponding to the current through said resistor (21);

said module (20) measuring the total current from said battery (B) to all of said loads (10, 11, 12) connected to the power bus (LB), said resistor (21) being connected to the power bus in line between said battery and said plurality of loads;

said module (20) also measuring a charging current supplied to the battery (B) and generating digital measuring data corresponding to the charging current;

the digital measuring data generated by said module (20) and corresponding to the measured battery current being applied to said electronic control means (16) via said control bus (CAN); and said electronic control means (16) monitoring the digital battery current data and producing signals for limiting the battery current to a predetermined admissible maximum value in response to said battery current data.

9. A device for current monitoring for use in a current supply system in which current is supplied to a plurality of loads (10, 11, 12) via a power bus (LB) common to said loads and a control bus (CAN) for digital control data connects a plurality of electronic control units (μC1, μC2 . . . μCn) among each other and with said loads, said device comprising:

a measuring resistor (30) comprising a resistance element (31) made of a metal alloy and having power connection parts (32) and voltage connections (49), and a semiconductor element (23) electrically connected to said voltage connection (49) of said resistor (30), for generation of digital measuring data corresponding to the current through the resistance element (31), said semiconductor element (23) being situated on a flat surface of said resistor (30) with a heat coupling connection with said resistance element (31).

10. Device according to claim 9, characterized in that said semiconductor element (23) contains a temperature sensor, and a temperature compensation circuit within said semiconductor element (23) corrects the current measuring signals in response to the temperature of the resistance element (31) measured by said temperature sensor.

11. A device according to claim 9 having a plate-shaped resistance element including main surfaces and opposite edges, characterized in that said semiconductor element (23) is located on one of said main surfaces of said plate-shaped resistance element (31) consisting of a resistance alloy, to which said opposite edges plate-shaped power connection parts (32) are welded.

12. A device according to claim 9 in which said resistance element (31) includes a metal surface, characterized in that said semiconductor element (23) is adhered directly onto said metal surface of said resistance element (31) and is connected to said power connection parts (32) by bonding wires (49).

13. A device according to claim 9 characterized in that said semiconductor element (23) is mounted on one side of a PCB (36), which is situated at its opposite side on said metal surface of said resistor (30) and is soldered to said power connection parts (32).

14. A device according to claim 9 characterized in that said semiconductor element (23) contains an A/D converter, an amplifier circuit, and/or a microprocessor for said measuring signals of said resistor (30).

15. A device according to claim 9 characterized in that a plug-in connector (41) is provided for connection to said control bus (CAN).

16. A device according to claim 15, characterized in that said plug-in connector is a component adhered to said metal surface of said resistor (30).

17. A device according to claim 15, characterized in that said plug-in connector (41) is a component located on said PCB (36) between said resistor (30) and said semiconductor element (23) and electrically connected to said semiconductor element (23).

18. System for current monitoring in a current supply system in which current is supplied from a power source to a plurality of switchable loads (10, 11, 12), each of a different resistance, via a power bus (LB) common to each of said loads (10, 11, 12), and in which a control bus (CAN) for digital information and control data is connected to electronic control means (16) and connects a plurality of electronic control units (μC1, μC2 . . . μCn) among each other and to said loads (10, 11, 12), the system comprising a current measuring module (20) including a sensor resistor (21) and a semiconductor element (23) generating digital measuring data corresponding to the current through said resistor (21), said resistor (21) being connected to said power bus (LB) in line between said power source and said plurality of loads (10, 11, 12) so that said module (20) measures the total current of all of said loads connected to the power bus, the digital measuring data generated by said module (20) and corresponding to said measured total current being applied to said electronic control means (16) via said control bus (CAN);

and the function of one of said switchable loads (10, 11, 12) being monitored by:

applying the digital total current measuring data to said electronic control means (16) before said one load is switched;

applying the new digital total current measuring data to said electronic control means after switching of said one load; and said electronic control means (16)

determining the difference between the two values of the digital total current measuring data provided before and after said switching;

evaluating said total current difference by comparing it with stored reference data, and generating a signal in case of abnormal deviation of the current difference from the reference data.

19. System for current monitoring in a current supply system in which current is supplied from a battery (B) to a plurality of switchable loads (10, 11, 12), each of a different resistance, via a power bus (LB) common to each of said loads (10, 11, 12), and in which a control bus (CAN) for digital information and control data is connected to electric control means (16) and connects a plurality for electronic control units ($\mu C1, \mu C2 \ldots \mu Cn$) to each other and to said loads (10, 11, 12), the system comprising a current measuring module (20) including a sensor resistor (21) and a semiconductor element (23) generating digital measuring data corresponding to the current through said resistor (21), said resistor (21) being connected to said power bus (LB) in line between said battery (B) and said plurality of loads (10, 11, 12) so that said module (20) measures the total current from said battery (B) to all of said loads (10, 11, 12) connected to the power bus (LB), the digital measuring data generated by said module (20) and corresponding to the measured battery current being applied to said electronic control means (16) via said control bus (CAN); and said electronic control means (16) monitoring the digital battery current data and producing signals for limiting the battery current to a predetermined admissible maximum value in response to said battery current data.

* * * * *